US012796566B2

United States Patent
(12) United States Patent
Noh

(10) Patent No.: US 12,796,566 B2
(45) Date of Patent: Nov. 10, 2026

(54) SEMICONDUCTOR PACKAGE AND METHOD OF MANUFACTURING THE SEMICONDUCTOR PACKAGE

(71) Applicant: Samsung Electronics Co., Ltd., Suwon-si (KR)

(72) Inventor: Hyunjun Noh, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 307 days.

(21) Appl. No.: 18/535,360

(22) Filed: Dec. 11, 2023

(65) Prior Publication Data

US 2024/0222324 A1 Jul. 4, 2024

(30) Foreign Application Priority Data

Jan. 2, 2023 (KR) ........................ 10-2023-0000096

(51) Int. Cl.
*H10W 90/00* (2026.01)
*H10W 70/65* (2026.01)
(Continued)

(52) U.S. Cl.
CPC ........... *H10W 90/00* (2026.01); *H10W 70/65* (2026.01); *H10W 74/117* (2026.01);
(Continued)

(58) Field of Classification Search
CPC ... H10W 90/00; H10W 70/65; H10W 74/117; H10W 72/877; H10W 72/884;
(Continued)

(56) References Cited

U.S. PATENT DOCUMENTS 10,319,702 B2 * 6/2019 Park ...................... H10W 90/00
11,101,262 B2 8/2021 Ng et al.
(Continued)

FOREIGN PATENT DOCUMENTS

JP 6797234 B2 12/2020
KR 10-2021-0099721 A 8/2021
KR 20220055112 A 5/2022

OTHER PUBLICATIONS

Korean Office Action for corresponding Korean Application No. 10-2023-0000096 dated Sep. 3, 2026.

*Primary Examiner* — Cuong B Nguyen
*Assistant Examiner* — Khatib A Rahman
(74) *Attorney, Agent, or Firm* — Harness, Dickey & Pierce, P.L.C.

(57) ABSTRACT

A semiconductor package includes a package substrate, first and second spacer chips attached to an upper surface of the package substrate and spaced apart from each other, a first semiconductor chip mounted on the upper surface of the package substrate and disposed between the first and second spacer chips, a plurality of second semiconductor chips sequentially stacked on the first and second spacer chips by adhesive films to cover the first semiconductor chip, and a sealing member on the package substrate and covering the first and second spacer chips, the first semiconductor chip, and the plurality of second semiconductor chips. At least a portion of the first spacer chip protrudes from one side of a lowermost second semiconductor chip among the plurality of second semiconductor chips, and the first spacer chip includes a groove at an upper surface of the protruded portion.

20 Claims, 18 Drawing Sheets

(51) Int. Cl.
*H10W 72/00* (2026.01)
*H10W 74/00* (2026.01)
*H10W 74/10* (2026.01)

(52) U.S. Cl.
CPC ........ *H10W 72/877* (2026.01); *H10W 72/884* (2026.01); *H10W 74/00* (2026.01); *H10W 90/724* (2026.01); *H10W 90/732* (2026.01); *H10W 90/734* (2026.01); *H10W 90/752* (2026.01); *H10W 90/754* (2026.01); *H10W 90/792* (2026.01); *H10W 90/794* (2026.01)

(58) Field of Classification Search
CPC . H10W 74/00; H10W 90/724; H10W 90/732; H10W 90/734; H10W 90/752; H10W 90/754; H10W 90/792; H10W 90/794; H10W 90/231; H10W 90/24; H10W 72/30; H10W 72/20; H10W 72/50; H10W 72/851; H10W 72/90
See application file for complete search history.

(56) References Cited

U.S. PATENT DOCUMENTS

| | | | | |
|---|---|---|---|---|
| 11,302,675 | B2 | 4/2022 | Maeda et al. | |
| 2019/0221542 | A1* | 7/2019 | Cho | H10W 90/00 |
| 2020/0105737 | A1* | 4/2020 | Ng | H10W 74/117 |
| 2020/0126919 | A1* | 4/2020 | Kang | H10B 69/00 |
| 2020/0328187 | A1* | 10/2020 | Cho | H10W 70/611 |
| 2021/0050328 | A1* | 2/2021 | Lee | H10W 20/42 |
| 2021/0082895 | A1* | 3/2021 | Miura | H10W 72/072 |
| 2021/0111152 | A1* | 4/2021 | Park | H10W 70/611 |
| 2021/0143008 | A1 | 5/2021 | Ko et al. | |
| 2021/0249382 | A1* | 8/2021 | Jeong | H10W 90/00 |
| 2021/0384167 | A1* | 12/2021 | Ye | H10P 54/00 |
| 2022/0059473 | A1* | 2/2022 | Park | H10W 42/121 |
| 2022/0068887 | A1* | 3/2022 | Chung | H10W 70/611 |
| 2022/0130793 | A1* | 4/2022 | Kang | H10W 90/00 |
| 2022/0246545 | A1 | 8/2022 | Wang et al. | |
| 2022/0302083 | A1 | 9/2022 | Ibaraki | |

* cited by examiner

100

100

SEMICONDUCTOR PACKAGE AND METHOD OF MANUFACTURING THE SEMICONDUCTOR PACKAGE

PRIORITY STATEMENT

This application claims priority under 35 U.S.C. § 119 to Korean Patent Application No. 10-2023-0000096, filed on Jan. 2, 2023 in the Korean Intellectual Property Office (KIPO), the contents of which are herein incorporated by reference in their entirety.

BACKGROUND

1. Field

Example embodiments relate to semiconductor packages and/or methods of manufacturing the semiconductor package. More particularly, example embodiments relate to semiconductor packages including a plurality of different chips stacked on a package substrate and manufacturing methods thereof.

2. Description of the Related Art

In a multi-chip package (MCP), a spacer chip may be used to support at least a portion of an overlying semiconductor chip. The overlying semiconductor chip may be attached to the spacer chip using an adhesive film such as a die attach film (DAF) by a die attach process. However, in a structure in which an upper surface of the spacer chip is partially exposed from the overlying semiconductor chip, when the semiconductor chip is pressed during the die attach process, a portion of the DAF having fluidity due to high pressure and temperature in the die attach process may flow onto the exposed upper surface of the spacer chip and then may invade an upper surface of the overlying semiconductor chip, thereby deteriorating reliability.

SUMMARY

Some example embodiments provide semiconductor packages having improved reliability and a structure capable of reducing or preventing process defects.

Some example embodiments provide methods of manufacturing the semiconductor package.

According to an example embodiment, a semiconductor package includes a package substrate extending in a first direction, a first spacer chip and a second spacer chip attached to an upper surface of the package substrate and spaced apart from each other in a second direction perpendicular to the first direction, a first semiconductor chip on the upper surface of the package substrate and between the first and second spacer chips, a plurality of second semiconductor chips sequentially stacked on the first and second spacer chips by adhesive films to cover the first semiconductor chip, and a sealing member on the package substrate and covering the first and second spacer chips, the first semiconductor chip, and the plurality of second semiconductor chips. At least a portion of the first spacer chip protrudes from one side of a lowermost second semiconductor chip among the plurality of second semiconductor chips, and the first spacer chip includes a groove at an upper surface of the protruded portion.

According to an example embodiment, a semiconductor package includes a package substrate extending in a first direction, a first semiconductor chip on an upper surface of the package substrate, a first spacer chip and a second spacer chip attached to the upper surface of the package substrate and spaced apart from each other in a second direction perpendicular to the first direction, the first semiconductor chip being interposed between the first and second spacer chips, a third spacer chip and a fourth spacer chip attached to the upper surface of the package substrate and spaced apart from each other in the first direction, the first semiconductor chip being interposed between the third and fourth spacer chips, a plurality of second semiconductor chips sequentially stacked on the first, second, third and fourth spacer chips by adhesive films to cover the first semiconductor chip, and a sealing member on the package substrate and covering the first, second, third and fourth spacer chips, the first semiconductor chip and the plurality of second semiconductor chips. At least a portion of the first spacer chip protrudes from one side of a lowermost second semiconductor chip among the plurality of second semiconductor chips, and a the first spacer chip includes a groove at an upper surface of the protruded portion.

According to an example embodiment, a semiconductor package includes a package substrate extending in a first direction, having an upper surface and a lower surface opposite to the upper surface, and having a plurality of substrate pads on the upper surface, a first semiconductor chip on the upper surface of the package substrate, a first spacer chip and a second spacer chip attached to the upper surface of the package substrate and spaced apart from each other in a second direction perpendicular to the first direction, the first semiconductor chip being interposed between the first and second spacer chips, a third spacer chip and a fourth spacer chip attached to the upper surface of the package substrate and spaced apart from each other in the first direction, the first semiconductor chip being interposed between the third and fourth spacer chips, a plurality of second semiconductor chips sequentially stacked on the first, second, third and fourth spacer chips by adhesive films to cover the first semiconductor chip, conductive connection members electrically connecting chip pads of the plurality of second semiconductor chips to the substrate pads, respectively, and a sealing member on the package substrate and covering the first, second, third and fourth spacer chips, the first semiconductor chip, and the plurality of second semiconductor chips. At least a portion of the first spacer chip protrudes from one side of a lowermost second semiconductor chip among the plurality of second semiconductor chips, the first spacer chip includes a groove having a depth and a width at an upper surface of the protruded portion, and the adhesive film on a bottom surface of the lowermost second semiconductor chip at least partially fills the groove of the first spacer chip.

According to some example embodiments, a semiconductor package may include first, second, third and fourth second spacer chips spaced apart from each other on a package substrate, with a first semiconductor chip interposed between the first, second, third and fourth spacer chips, a plurality of second semiconductor chips sequentially stacked on the first, second, third and fourth spacer chips by adhesive films to cover the first semiconductor chip, and a sealing member on the package substrate and covering the first, second, third and fourth spacer chips, the first semiconductor chip, and the plurality of second semiconductor chips.

At least a portion of the fourth spacer chip may be disposed to protrude from one side of a lowermost second semiconductor chip, and the fourth spacer chip may include a groove at an upper surface of the protruded portion thereof.

The lowermost second semiconductor chip to which a first adhesive film is attached may be attached to the first, second, third and fourth spacer chips and the first semiconductor chip by a thermal compression process. The first adhesive film such as DAF having fluidity due to pressure and temperature in the thermal compression process may at least partially fill the groove in the upper surface of the fourth spacer chip that protrudes from the sidewall of the second semiconductor chip, thereby mitigating or preventing the DAF from penetrating into an upper surface of the lowermost second semiconductor chip.

BRIEF DESCRIPTION OF THE DRAWINGS

Example embodiments will be more clearly understood from the following detailed description taken in conjunction with the accompanying drawings.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
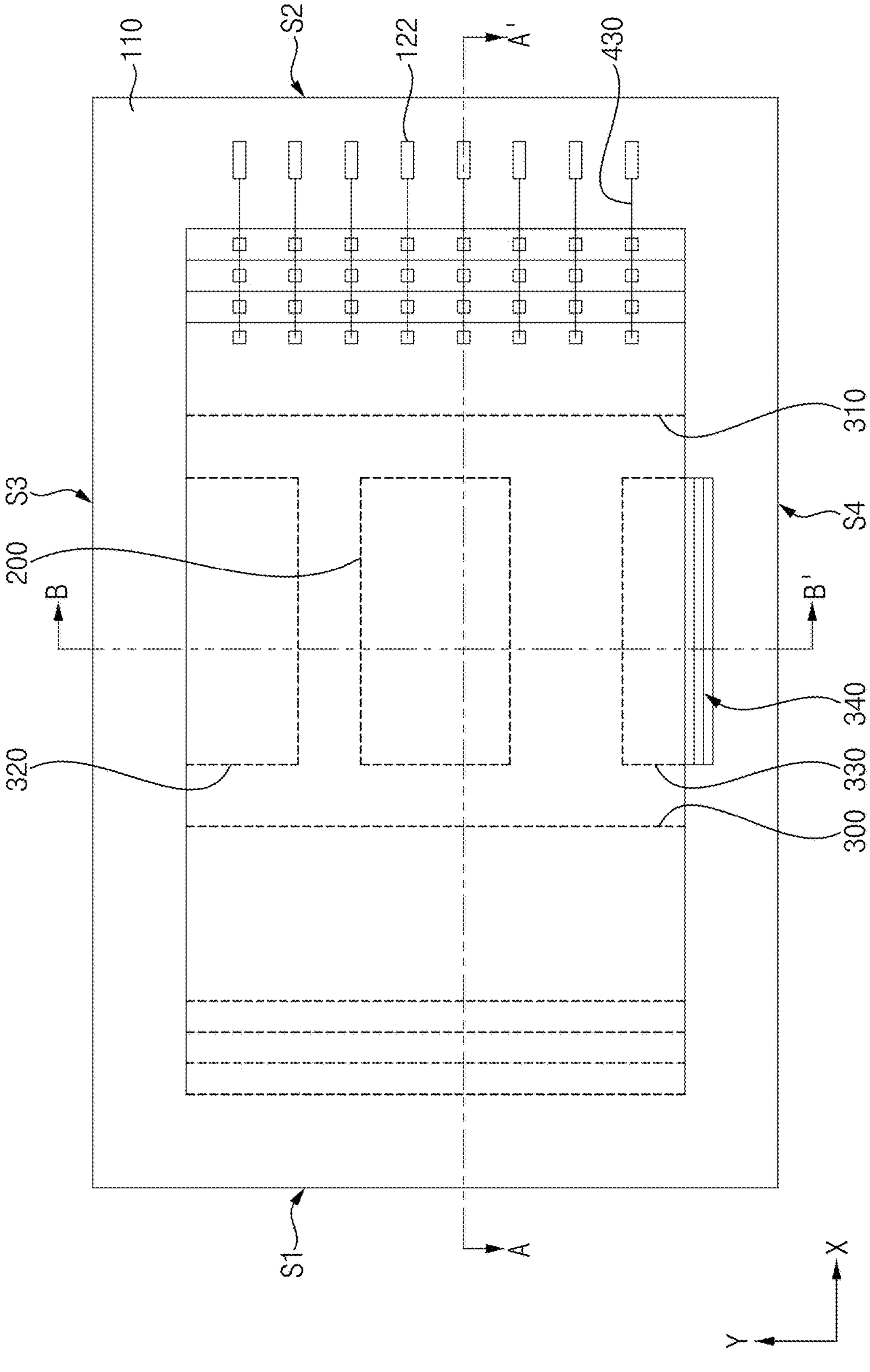
FIGS. 1 to 19 represent non-limiting, example embodiments as described herein.

FIG. 1 is a plan view illustrating a semiconductor package in accordance with an example embodiment.

Figure 2:
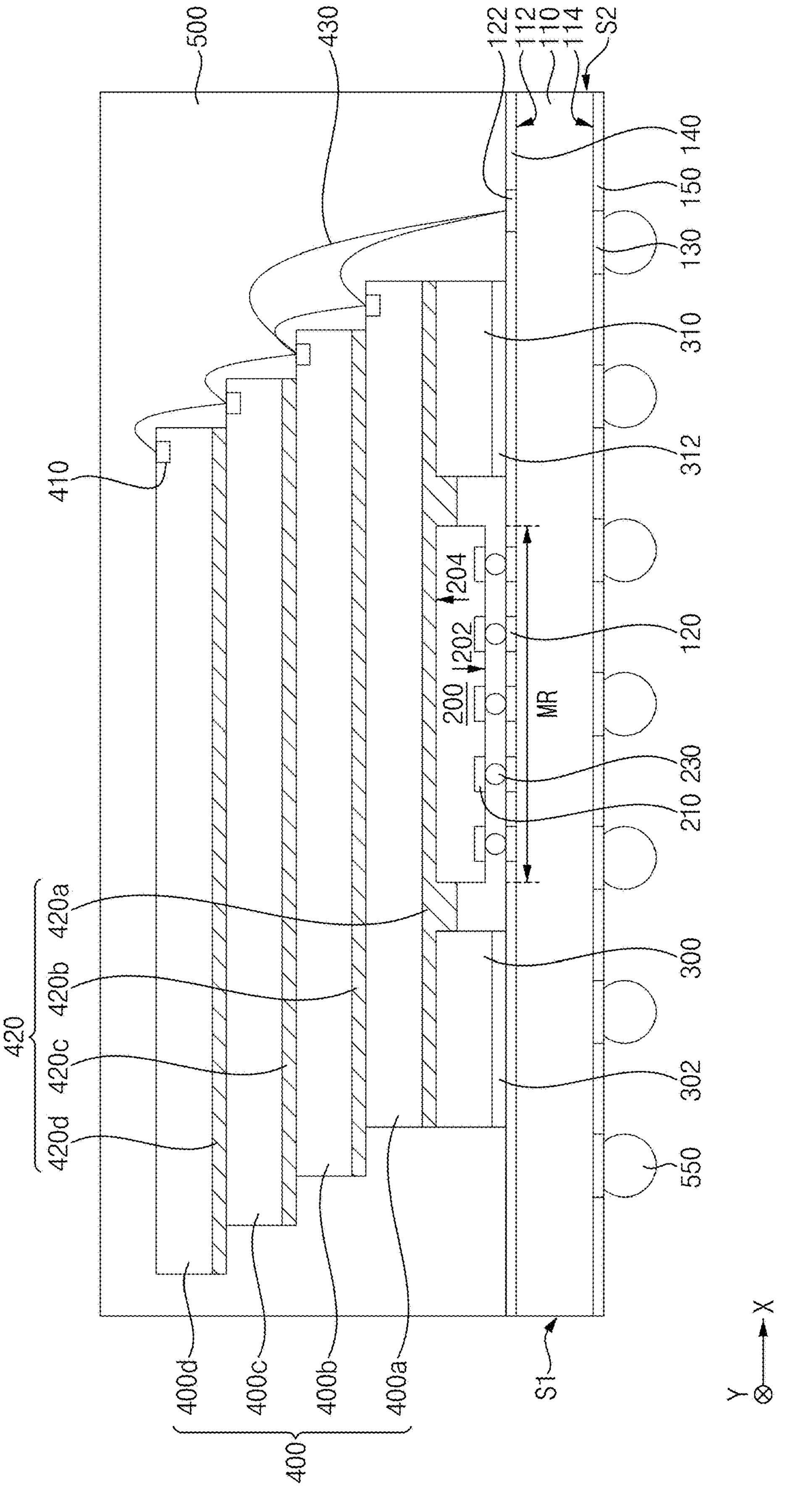

FIG. 2 is a cross-sectional view taken along the line A-A' in FIG. 1.

Figure 3:
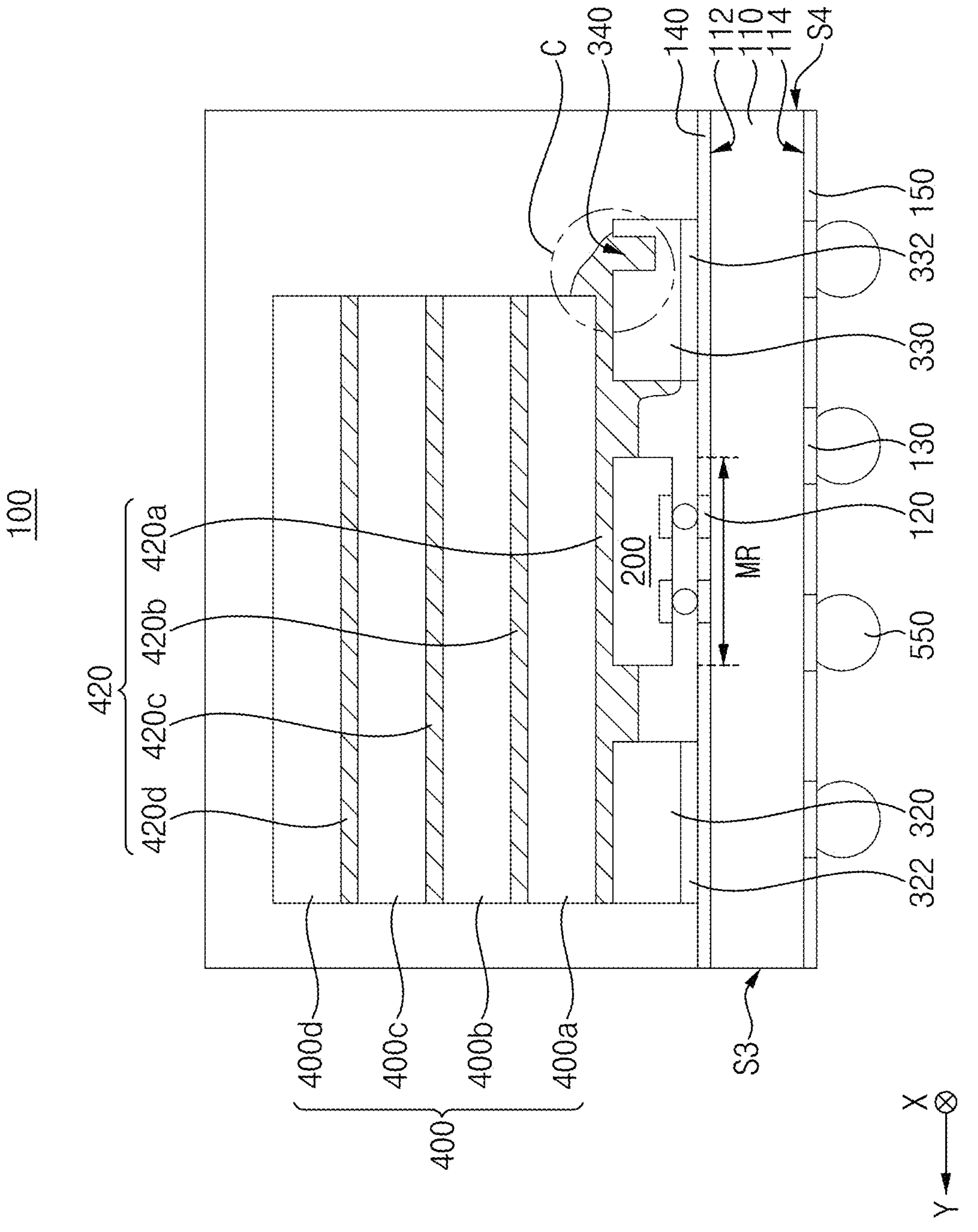

FIG. 3 is a cross-sectional view taken along the line B-B' in FIG. 1.

Figure 4:
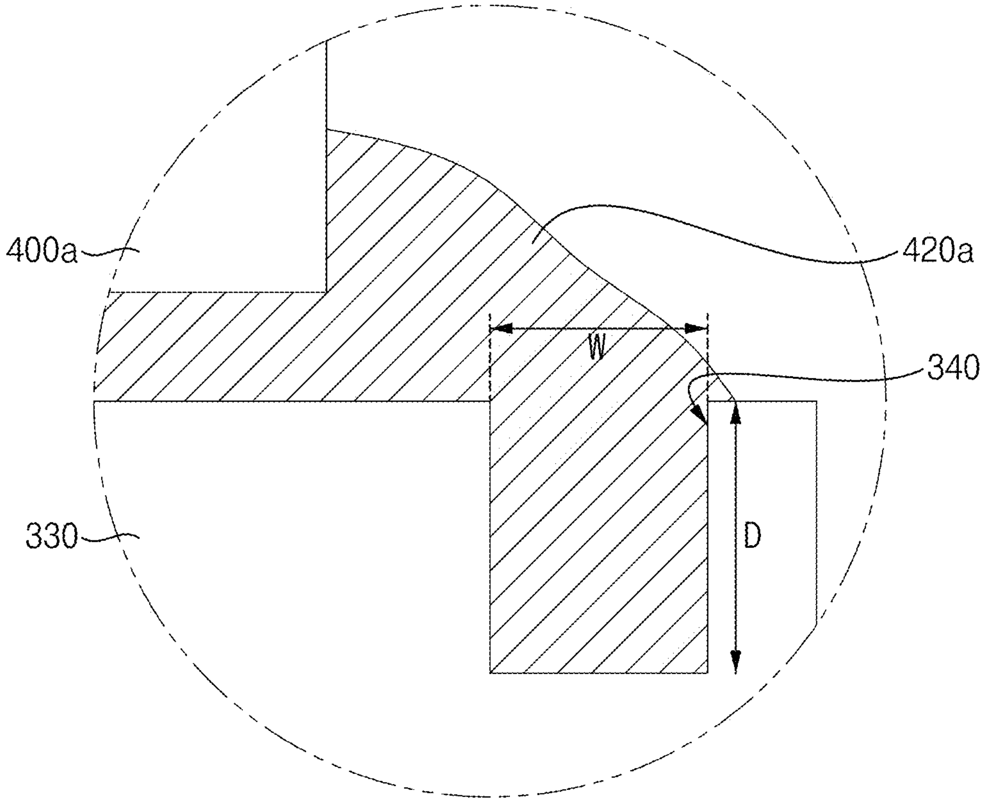

FIG. 4 is an enlarged cross-sectional view illustrating portion 'C' in FIG. 3.

FIGS. 5 to 19 are views illustrating a method of manufacturing a semiconductor package in accordance with an example embodiment.

DETAILED DESCRIPTION

Hereinafter, some example embodiments will be explained in detail with reference to the accompanying drawings.

FIG. 1 is a plan view illustrating a semiconductor package in accordance with an example embodiment. FIG. 2 is a cross-sectional view taken along the line A-A' in FIG. 1. FIG. 3 is a cross-sectional view taken along the line B-B' in FIG. 1. FIG. 4 is an enlarged cross-sectional view illustrating portion 'C' in FIG. 3. FIG. 1 is a plan view illustrating the semiconductor package of FIGS. 2 and 3, wherein a sealing member is omitted.

Referring to FIGS. 1 to 4, a semiconductor package 100 may include a package substrate 110, at least one first semiconductor chip 200, at least one spacer chip 330, a plurality of second semiconductor chips 400, and a sealing member 500. The semiconductor package 100 may further include conductive connection members 230 and 430 electrically connecting the first semiconductor chip 200 and the second semiconductor chip 400 to the package substrate 110. In addition, the semiconductor package 100 may further include external connection members 550.

Additionally, the semiconductor package 100 may be a multi-chip package (MCP) such as a universal flash storage (UFS) including different types of semiconductor chips. The semiconductor package 100 may be a System In Package (SIP) in which a plurality of semiconductor chips are stacked or arranged in one package to perform all or most of the functions of an electronic system.

In some example embodiments, the package substrate 110 may be a substrate having an upper surface 112 and a lower surface 114 opposite to the upper surface 112. For example, the package substrate 110 may include a printed circuit board (PCB), a flexible substrate, a tape substrate, etc. The printed circuit board may be a multilayer circuit board having vias and various circuits therein. The package substrate 110 may include internal wires that serve as channels for electrical connection between the first semiconductor chip 200 and the second semiconductor chips 400.

The package substrate 110 may include a first side portion S1 and a second side portion S2 extending in a direction perpendicular to the upper surface 112 and parallel with a second direction (Y direction) and facing each other, and a third side portion S3 and a fourth side portion S4 extending in a direction parallel with a first direction (X direction) perpendicular to the second direction and facing each other.

The package substrate 110 may have a chip mounting region MR in a central region. As will be described below, the chip mounting region MR may be a region where the first semiconductor chip 200 as a controller chip is mounted. The chip mounting region MR may have a rectangular shape.

The package substrate 110 may include first substrate pads 120 arranged in the chip mounting region MR and second substrate pads 122 arranged along one side portion S2 of the package substrate 110. The first and second substrate pads 120 and 122 may be respectively connected to the wires. The wires may extend in the upper surface 112 of the package substrate 110 or inside the package substrate 110. For example, at least a portion of the wire may be used as the substrate pad, which functions as a landing pad.

Although some substrate pads are illustrated, the number, shapes and locations of the substrate pads are exemplarily illustrated, and thus, it may not be limited thereto. Because the wirings as well as the substrate pads are well known in the art to which the present inventive concepts pertain, illustration and description concerning the above elements will be omitted.

A first insulation layer 140 may be formed on the upper surface 112 of the package substrate 110 to expose the first and second substrate pads 120 and 122. The first insulation layer 140 may cover the entire upper surface 112 of the package substrate 110 except for the first and second substrate pads 120 and 122. For example, the first insulation layer may include a solder resist.

In some example embodiments, the first semiconductor chip 200 may be mounted on the chip mounting region MR of the package substrate 110. The first semiconductor chip 200 may be mounted on the package substrate 110 via conductive bumps 230. The first semiconductor chip 200 may be disposed such that a front surface 202 (e.g., an active surface) on which first chip pads 210 are formed, faces the package substrate 110. When viewed in plan view, the first semiconductor chip 200 may have a quadrangular shape having four sides. The first chip pads 210 may be arranged in an array form over the entire front surface 202 of the first semiconductor chip 200.

The first semiconductor chip 200 may be a logic chip including a logic circuit. The logic chip may be a controller that controls memory chips. The first semiconductor chip may be a processor chip such as an ASIC and an application processor (AP) serving as a host such as a CPU, GPU, or SOC.

The first semiconductor chip 200 may be mounted on the package substrate 110 by a flip chip bonding method. The first chip pads 210 of the first semiconductor chip 200 may be electrically connected to the first substrate pads 120 of the package substrate 110 by the conductive bumps 230, for example, solder bumps.

For example, a thickness of the first semiconductor chip 200 may be within a range of 90 μm to 110 μm. A height of the conductive bump 230 from the upper surface 112 of the package substrate 110 may be within a range of 35 μm to 60 μm. A height of the first semiconductor chip 200 from the upper surface 112 of the package substrate 110 may be within a range of 135 μm to 160 μm. The height of the first semiconductor chip 200 may be equal to or greater than heights of upper surfaces of the first, second, third and fourth spacer chips 300, 310, 320 and 330. In other words, an upper surface of the first semiconductor chip 200 from the upper surface 112 of the package substrate 110 may be equal to or at a higher level than heights of upper surfaces of the first, second, third and fourth spacer chips 300, 310, 320 and 330 from the upper surface 112 of the package substrate 110.

In some example embodiments, the first semiconductor chip may be attached to the upper surface 112 of the package substrate 110 by an adhesive film. In such cases, the first chip pads 210 of the first semiconductor chip 200 may be connected to the substrate pads on the upper surface 112 of the package substrate 110 by conductive connection members. The conductive connection members may include bonding wires.

In some example embodiments, the first, second, third and fourth spacer chips 300, 310, 320 and 340 as a support frame structure may be disposed on the package substrate 110 to surround the first semiconductor chip 200 on the chip mounting region MR. The first, second, third and fourth spacer chips 300, 310, 320 and 330 may be attached to the upper surface 112 of the package substrate 110 by adhesive films 302, 312, 322 and 332 to be spaced apart from each other.

The first and second spacer chips 300 and 310 may be spaced apart from each other in the first direction (X direction) with the chip mounting area MR interposed between the first and second spacer chips 300 and 310. The third and fourth spacer chips 320 and 330 may be spaced apart from each other in the second direction (Y direction) with the chip mounting region MR interposed between the third and fourth spacer chips 320 and 330. The first spacer chip 300 may be disposed adjacent to the first side portion S1, the second spacer chip 310 may be disposed adjacent to the second side portion S2, the third spacer chip 320 may be disposed adjacent to the third side portion S3, and the fourth spacer chip 330 may be disposed adjacent to the fourth side portion S4.

In some example embodiments, the plurality of second semiconductor chips 400 may be attached to the first, second, third and fourth spacer chips 300, 310, 320 and 330 using an adhesive film 420. A lowermost second semiconductor chip 400*a* among the plurality of second semiconductor chips may be attached to the first, second, third and fourth spacer chips 300, 310, 320 and 330 using a first adhesive film 420*a*. The remaining chips 400*b*, 400*c* and 400*d* among the plurality of second semiconductor chips may be sequentially attached on the lowermost second semiconductor chip 400*a* using second adhesive films 420*b*, 420*c* and 420*d*.

The second semiconductor chip may include a memory chip including a memory circuit. For example, the second semiconductor chip may include a volatile memory device such as an SRAM device, a DRAM device, etc. and a nonvolatile memory device such as a flash memory device, a PRAM device, an MRAM device, an RRAM device, etc.

The lowermost second semiconductor chip 400*a* may be attached on the first, second, third and fourth spacer chips 300, 310, 320 and 330 and the first semiconductor chip 200 using the first adhesive film 420*a* such as a die attach film (DAF) by a die attach process.

The second semiconductor chip 400*a* may be disposed such that a backside surface (e.g., a non-active surface) opposite to a front surface on which second chip pads 410 are formed faces the package substrate 110. When viewed in plan view, the second semiconductor chip 400*a* may have a quadrangular shape having four sides.

As illustrated in FIGS. 1 and 3, in some example embodiments, at least a portion of the fourth spacer chip 330 may protrude from one side of the lowermost second semiconductor chip 400*a*. A groove 340 may be provided in an upper surface of the at least a portion of the fourth spacer chip 330 that protrudes from a sidewall of the lowermost second semiconductor chip 400*a*. The groove 340 may be provided in the upper surface of the fourth spacer chip 330. The groove 340 may extend in the first direction (X direction). The groove 340 may extend along a peripheral region of the spacer chip 330.

For example, a depth D of the groove 340 may be within a range of 30% to 70% of a thickness T of the spacer chip 330. A width W of the groove 340 may be the same as or substantially equal to a width of the portion sawed by a blade. The depth D of the groove 340 may be within a range of 10 μm to 80 μm, and the width W of the groove 340 may be within a range of 20 μm to 120 μm. A length of one side of the spacer chip 330 may be within a range of 2 mm to 8 mm. The thickness T of the spacer chip 330 may be within a range of 40 μm to 120 μm.

For example, the first adhesive film 420*a* may be attached to the backside surface of the second semiconductor chip 400*a*, and the second semiconductor chip 400*a* to which the first adhesive film 420*a* is attached may be attached on the first, second, third and fourth spacer chips 300, 310, 320 and 330 and the first semiconductor chip 200 by a thermal compression process. The second semiconductor chip 400*a* may be pressed onto the first, second, third and fourth spacer chips 300, 310, 320 and 330 by a die attaching tool, and then may be heated to a high temperature by a heater block inside a support system that supports the package substrate 110. A thickness of the first adhesive film 420*a* may be within a range of 60 μm to 120 μm.

As illustrated in FIG. 4, a portion of DAF having fluidity due to pressure and temperature may flow on the upper surface of the fourth spacer chip 330 that protrudes from the sidewall of the second semiconductor chip 400*a* and then may at least partially fill the groove 340 of the fourth spacer chip 330. Accordingly, it may be possible to mitigate or prevent the portion of the DAF from overflowing to penetrate into (e.g., overflowing onto) an upper surface of the lowermost second semiconductor chip 400*a*.

The remaining chips 400$b$, 400$c$ and 400$d$ among the plurality of second semiconductor chips may be sequentially attached to the lowermost second semiconductor chip 400$a$ by second adhesive films 420$b$, 420$c$ and 420$d$, respectively. The second semiconductor chips 400$b$, 400$c$ and 400$d$ may be sequentially attached to the lowermost second semiconductor chip 400$a$ using the second adhesive film 420$b$, 420$c$ and 420$d$ such as a die attach film (DAF) by a die attach process. Thicknesses of the second adhesive films 420$b$, 420$c$ and 420$d$ may be within a range of 10 μm to 20 μm.

A planar area of the second semiconductor chip may be greater than a planar area of the first semiconductor chip or the support frame structure. Accordingly, the second semiconductor chips 400$a$, 400$b$, 400$c$ and 400$d$ may be supported and mounted on the package substrate 110 by the first, second, third and fourth spacer chips 300, 310, 320 and 330.

The plurality of second semiconductor chips 400$a$, 400$b$, 400$c$ and 400$d$ may be sequentially offset aligned. For example, the second semiconductor chips 400$a$, 400$b$, 400$c$, and 400$d$ may be stacked in a cascade structure. The second semiconductor chips 400$a$, 400$b$, 400$c$ and 400$d$ may be sequentially offset aligned in a first lateral direction (−X direction) of the package substrate 110.

The number, sizes, arrangements, etc. of the second semiconductor chips are provided as examples, and it will be understood that the present inventive concepts are not limited thereto. Additionally, although only a few second chip pads are illustrated in the figures, the structures, shapes, and arrangements of the second chip pads are provided as examples, and it will be understood that the present inventive concepts are not limited thereto.

In some example embodiments, the second semiconductor chips 400 may be electrically connected to the package substrate 110 by conductive connection members 430.

For example, the second chip pads 410 of the second semiconductor chips 400 may be connected to the second substrate pads 122 on the upper surface 112 of the package substrate 110 by bonding wires 430.

In some example embodiments, the sealing member 500 may cover the first, second, third and fourth spacer chips 300, 310, 320 and 330, the second semiconductor chips 400 and the bonding wires 430 on the upper surface 112 of the package substrate 110. The sealing member may include a thermosetting resin, for example, epoxy molding compound (EMC).

In some example embodiments, external connection pads 130 for providing electrical signals may be formed on the lower surface 114 of the package substrate 110. The external connection pads 130 may be exposed by a second insulating layer 150. The second insulating layer may include a silicon oxide layer, a silicon nitride layer, or a silicon oxynitride layer. An external connection member 550 may be disposed on the external connection pad 130 of the package substrate 110 for electrical connection with an external device. For example, the external connection member 550 may be a solder ball. The semiconductor package 100 may be mounted on a module substrate via the solder balls to provide a memory module.

As mentioned above, the semiconductor package 100 may include the first, second, third and fourth spacer chips 300, 310, 320, and 330 that are spaced apart from each other on the package substrate 110 with the first semiconductor chip 200 interposed therebetween, the plurality of second semiconductor chips 400 attached to the first, second, third and fourth spacer chips 300, 310, 320 and 330 by the adhesive films 420 so as to cover the semiconductor chip 200 and electrically connected to the package substrate by the plurality of bonding wires 430, and the sealing member 500 covering the second semiconductor chips 400 on the package substrate 110.

At least a portion of the fourth spacer chip 330 may be disposed to protrude from one side of the lowermost second semiconductor chip 400$a$, and the groove 340 may be provided in the upper surface of the at least portion of the fourth spacer chip 330 that protrudes from the sidewall of the lowermost second semiconductor chip 400$a$.

The lowermost second semiconductor chip 400$a$ to which the first adhesive film 420$a$ is attached may be attached to the first, second, third and fourth spacer chips 300, 310, 320, 330 and the first semiconductor chip 200 by a thermal compression process. A portion of the first adhesive film (DAF) having fluidity due to the pressure and temperature in the thermal compression process may at least partially fill the groove 340 in the upper surface of the fourth spacer chip 330 that protrudes from the sidewall of the second semiconductor chip 400$a$, to thereby mitigate or prevent the portion of the DAF from penetrating into (e.g., overflowing onto) the upper surface of the lowermost second semiconductor chip 400$a$.

Thus, the second lowermost second semiconductor chip 400$b$ may be prevented/reduced from being lifted from the lowermost second semiconductor chip 400$a$, and thus EMC may be prevented/reduced from penetrating therebetween during the subsequent molding process, thereby preventing/reducing process defects and improving reliability of the semiconductor package.

Hereinafter, a method of manufacturing the semiconductor package of FIG. 1 will be described.

Figure 5:
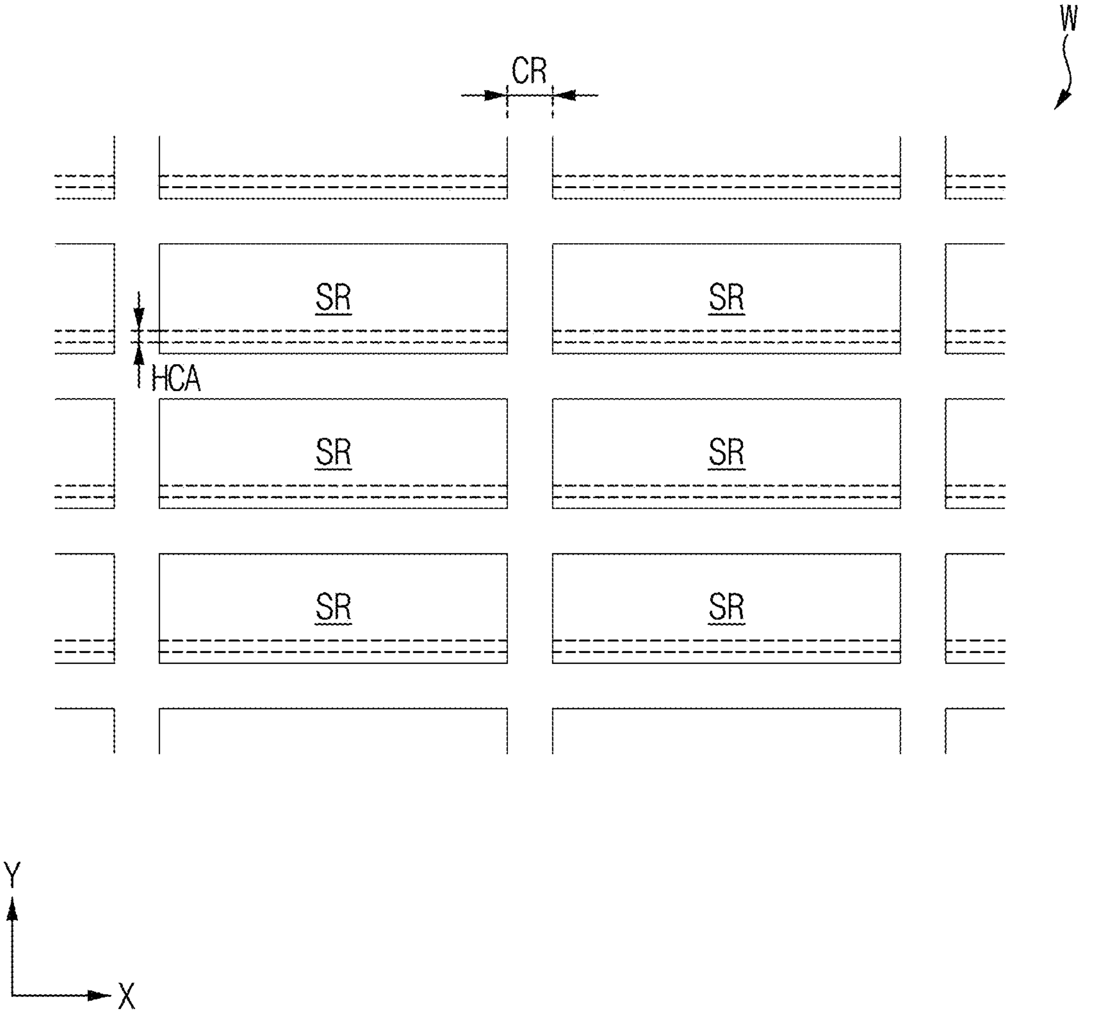
Figure 6:
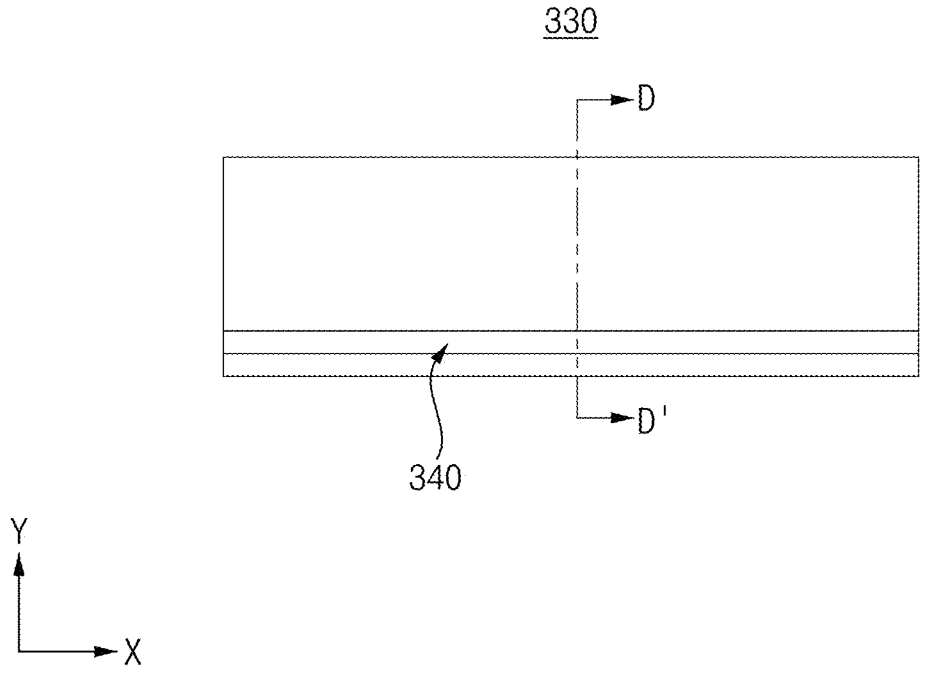
Figure 7:
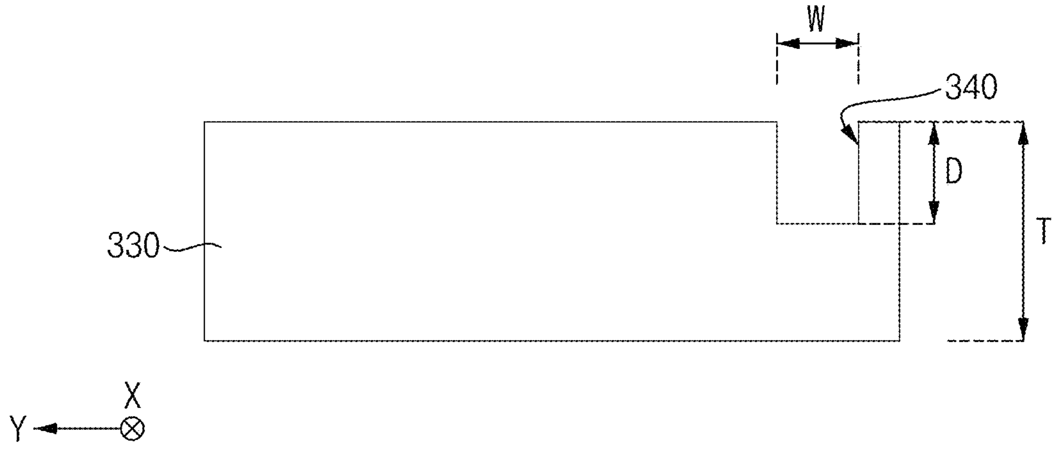
Figure 8A:
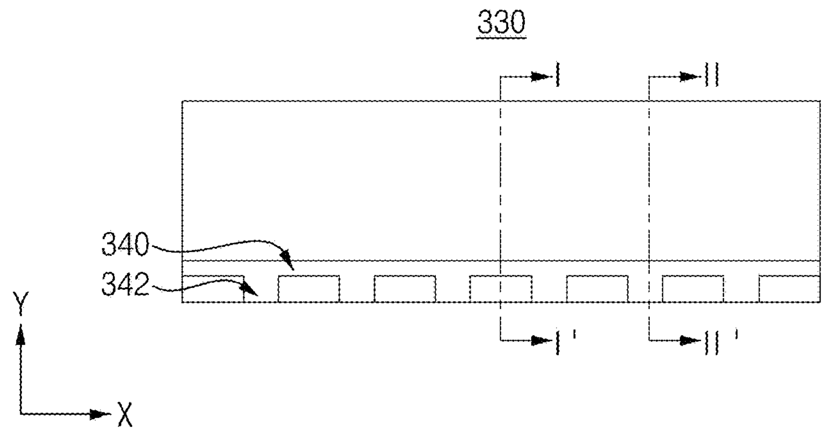
Figure 8B:
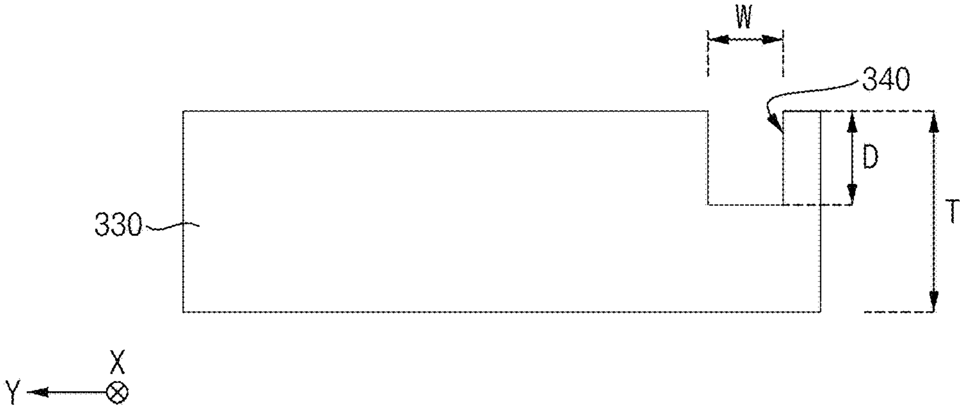
Figure 8C:
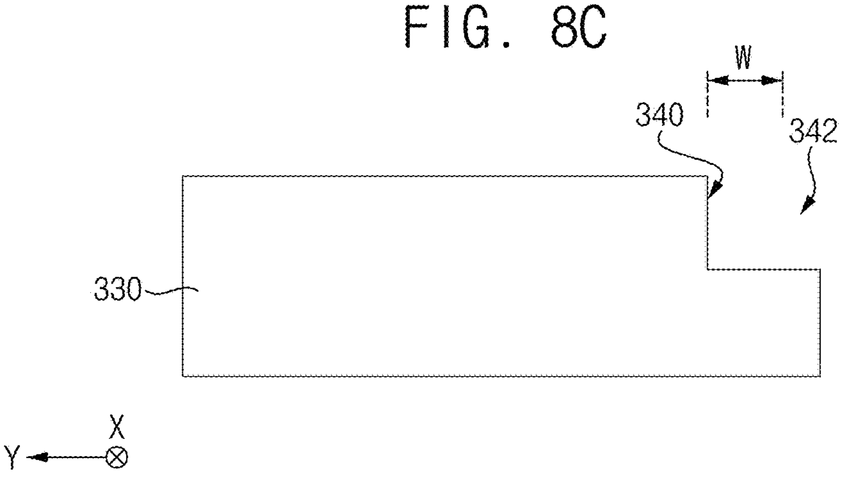
Figure 9:
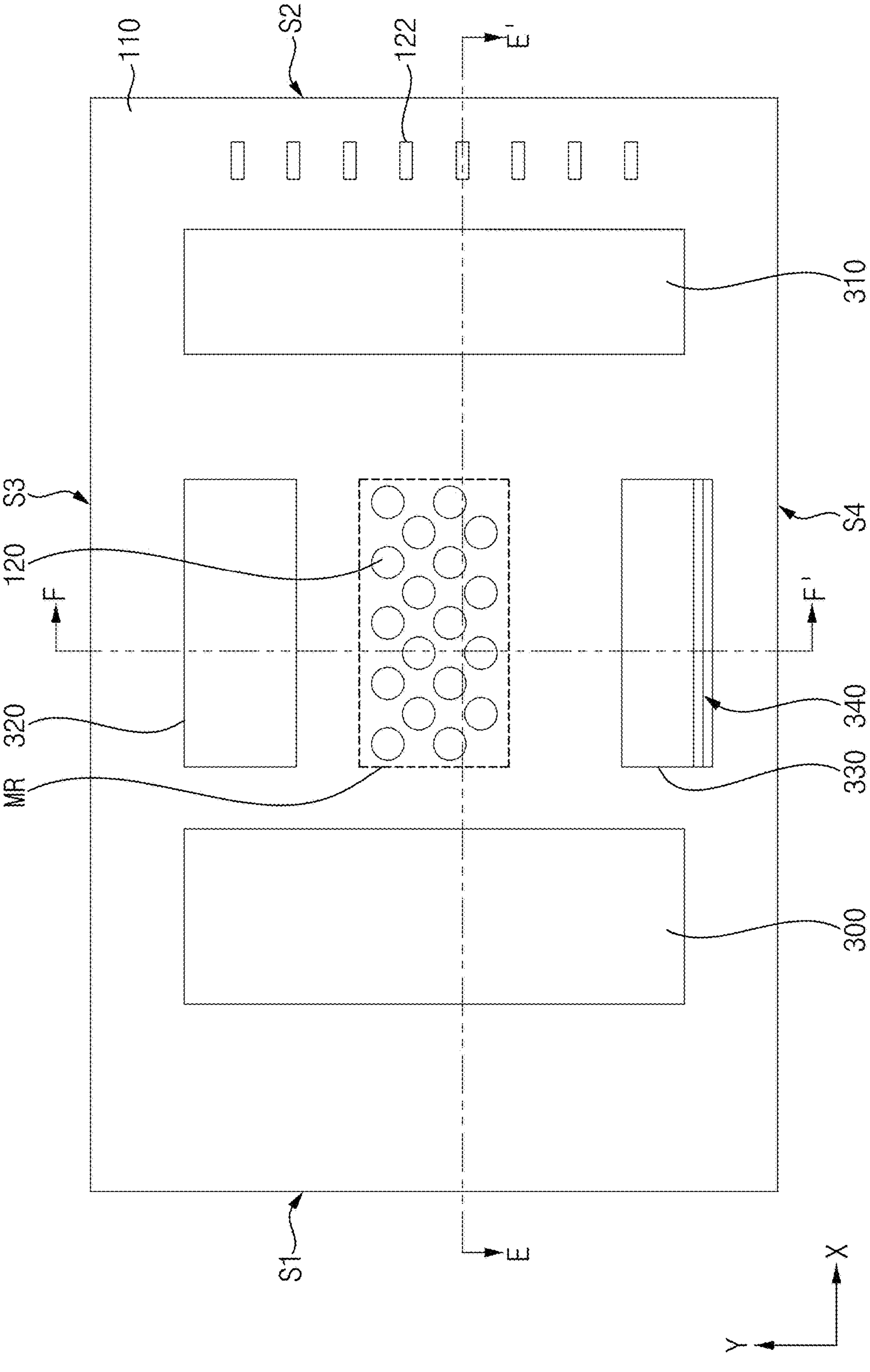

FIGS. 5 to 19 are views illustrating a method of manufacturing a semiconductor package in accordance with an example embodiment. FIG. 5 is a plan view illustrating a portion of a wafer including spacer chips formed therein. FIG. 6 is a plan view illustrating a spacer chip formed by a blade sawing process. FIG. 7 is a cross-sectional view taken along the line D-D' in FIG. 6. FIG. 8A is a plan view illustrating a spacer chip according to another example embodiment. FIG. 8B is a cross-sectional view taken along the line I-I' in FIG. 8A. FIG. 8C is a cross-sectional view taken along the line II-II' in FIG. 8A. FIG. 9 is a plan view illustrating a package substrate on which spacer chips are disposed. FIGS. 10, 12, 14, 16, and 18 are cross-sectional views taken along the line E-E' in FIG. 9. FIGS. 11, 13, 15, 17, and 19 are cross-sectional views taken along the line F-F' in FIG. 9.

Referring to FIGS. 5 to 8C, individual spacer chips 330 may be formed by cutting a wafer W through a sawing process.

As illustrated in FIG. 5, after a backside surface of the silicon wafer W is partially removed by a polishing process so that the wafer has a desired thickness, the silicon wafer W may be mounted on an adhesive tape sheet (not illustrated) (Wafer Mounting).

In example embodiments, the wafer W may include a spacer chip region SR and a cutting region CR defining the spacer chip region SR. A groove region HCA may be provided in the spacer chip region SR. The wafer may include, for example, silicon, germanium, silicon-germanium, or III-V compound compounds, e.g., GaP, GaAs, GaSb, etc. The wafer may be polished to have a thickness of, for example, 40 μm to 120 μm.

After attaching the adhesive tape sheet on a ring frame (not illustrated), the wafer W may be attached on the adhesive tape sheet. For example, the ring frame may have an annular shape. The adhesive tape sheet may be a dicing adhesive tape having a circular shape.

Then, the silicon wafer W may be cut by a sawing process using a blade to be separated into the individual spacer chips 330.

First, an upper surface of the groove region HCA may be partially removed using the blade to form a groove 340 in the upper surface of the spacer chip 330. Then, the cutting region CR may be removed (e.g., cut) using the blade to form the individual spacer chips 330 of FIG. 6. Then, the adhesive tape sheet may be expanded in a radial direction by a tape expanding apparatus, so that the divided spacer chips 310 on the adhesive tape sheet may be spaced apart from each other in the radial direction.

For example, the groove 340 may be formed using a single blade. In some example embodiments, the groove 340 may be formed by performing a step cutting in which the upper surface of the groove region HCA is cut several times using two blades. By the step cutting, the groove 340 may include a first recess having a first depth from an upper surface 311*a* of the spacer chip 310 and a second recess having a second depth from the first recess. Sidewalls of the first and second recesses may extend in a thickness direction or an inclined direction. For example, the first and second recesses may have a C-shaped cross-sectional structure or a V-shaped cross-sectional structure.

As illustrated in FIGS. 6 and 7, the groove 340 may be formed in the upper surface of the spacer chip 330. The groove 340 may extend in a first direction. The groove 340 may extend along a peripheral region of the spacer chip 330.

For example, a depth D of the groove 340 may be within a range of 30% to 70% of the thickness of the spacer chip 330. A width W of the groove 340 may be the same as or substantially equal to a width of the portion sawed by the blade. The depth D of the groove 340 may be within a range of 10 μm to 80 μm, and the width W of the groove 340 may be within a range of 20 μm to 120 μm. A length of one side of the spacer chip 330 may be within a range of 2 mm to 8 mm. The thickness T of the spacer chip 330 may be within a range of 40 μm to 120 μm.

As illustrated in FIGS. 8A, 8B and 8C, the spacer chip 330 having a groove 340 and a second groove 342 formed therein may be provided as a fourth spacer chip.

The groove 340 and the second groove 342 may be formed in the upper surface of the spacer chip 330. The second groove 342 may extend to cross the groove 340. For example, the groove 340 may extend in a first direction (e.g., X direction) and the second groove 342 may extend in a second direction (e.g., Y direction) perpendicular to the first direction. A plurality of the second grooves 342 may be spaced apart from each other in the first direction (e.g., X direction).

The second groove may extend across the groove 340. The second groove 342 may extend from the groove 340 to a first side surface of the spacer chip 330. However, it may not be limited thereto, and the second groove may be formed to extend from the first side surface of the spacer chip 330 to a second side surface opposite to the first side surface.

Figure 10:
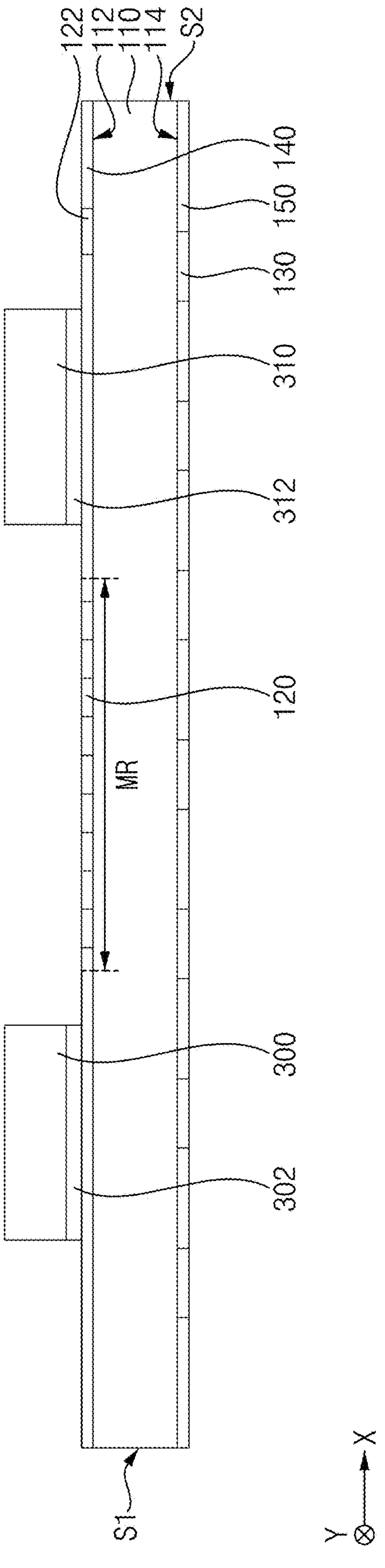
Figure 11:
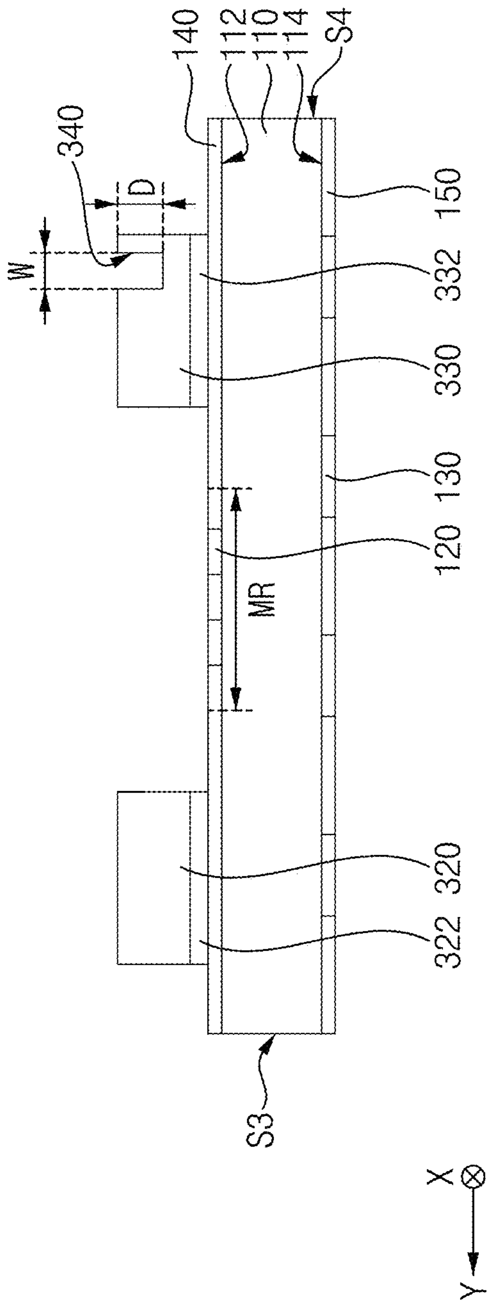

Referring to FIGS. 9 to 11, at least one spacer chip may be disposed on a package substrate 110. The at least one spacer chip may include the spacer chip 330 of FIG. 6 in which the groove 340 is formed.

In some example embodiments, the package substrate 110 may be a substrate having an upper surface 112 and a lower surface 114 opposite to the upper surface 112. For example, the package substrate 110 may be a printed circuit board (PCB). The printed circuit board may be a multilayer circuit board having vias and various circuits therein. The package substrate 110 may include internal wires serving as channels for electrical connection between first and second semiconductor chips as will be described below.

The package substrate 110 may a first side portion S1 and a second side portion S2 extending in a direction perpendicular to the upper surface 112 and parallel with a second direction (Y direction) and facing each other, and a third side portion S3 and a fourth side portion S4 extending in a direction parallel with the first direction (X direction) and facing each other.

The package substrate 110 may have a chip mounting region MR in a central area. As will be described below, the chip mounting region MR may be a region where a first semiconductor chip as a controller chip is mounted. The chip mounting region MR may have a rectangular shape.

For example, a width of the package substrate 110 in the first direction (X direction) may range from 10 mm to 15 mm, and a width of the package substrate 110 in the second direction (Y direction) may range from 4 mm to 7 mm. A side of the chip mounting region MR may have a length within a range of 2 mm to 4 mm.

The package substrate 110 may include first substrate pads 120 arranged in the chip mounting region MR and second substrate pads 122 arranged along one side portion S2 of the package substrate 110. The first and second substrate pads 120 and 122 may be connected to the wires, respectively. The wires may extend from the upper surface 112 of the package substrate 110 or inside the of the package substrate 110. For example, at least a portion of the wire may be used as the substrate pad, which functions as a landing pad.

Although only some substrate pads are illustrated in the figures, the number, shape, and arrangement of the substrate pads are provided as examples, and it will be understood that the present inventive concepts are not limited thereto. Because the wirings including the substrate pads are widely known in the art to which the present inventive concepts pertain, illustration and description thereof will be omitted.

A first insulating layer 140 may be formed on the upper surface 112 of the package substrate 110 to expose the first and second substrate pads 120 and 122. The first insulating layer 140 may cover the entire upper surface 112 of the package substrate 110 except for the first and second substrate pads 120 and 122. For example, the first insulating layer may include a solder resist.

In some example embodiments, first, second, third and fourth spacer chips 300, 310, 320 and 340 as a support frame structure may be disposed on the package substrate 110 to surround the chip mounting region MR. The first, second, third and fourth spacer chips 300, 310, 320 and 330 may be attached to the upper surface 112 of the package substrate 110 by using adhesive films 302, 312 322 and 332 to be spaced apart from each other.

The first and second spacer chips 300 and 310 may be spaced apart from each other in the first direction (X direction) with the chip mounting region MR interposed therebetween. The third and fourth spacer chips 320 and 330 may be spaced apart from each other in the second direction (Y direction) with the chip mounting region MR interposed therebetween. The first, second, third and fourth spacer chips 300, 310, 320, and 330 may be formed by cutting the silicon wafer W through a sawing process, and then, may be attached on the upper surface 112 of the package substrate 110 using the adhesive films 302, 312, 322 and 332 by a die attach process. The groove 340 may be formed in the upper surface of the fourth spacer chip 330.

Figure 12:
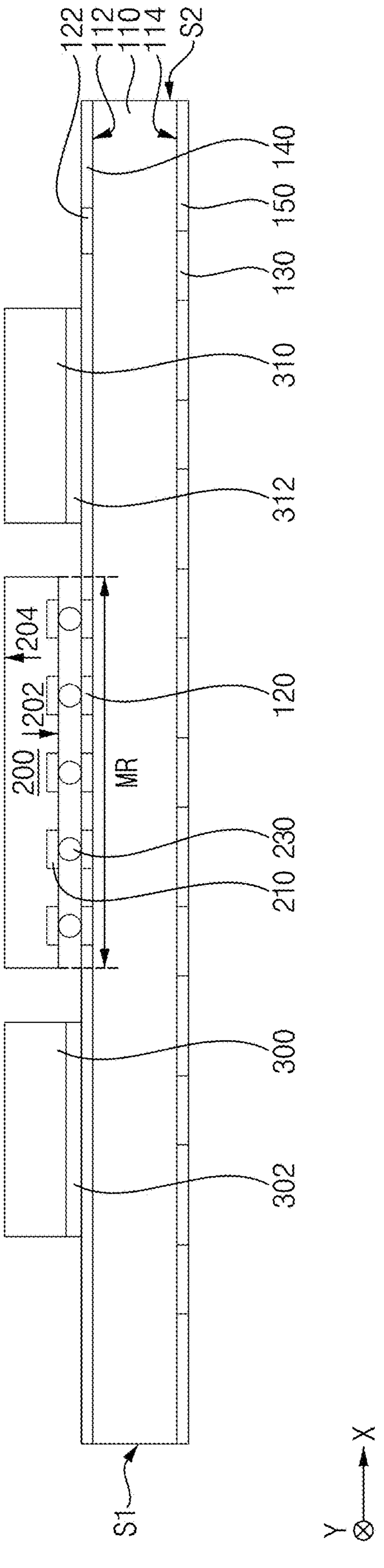
Figure 13:
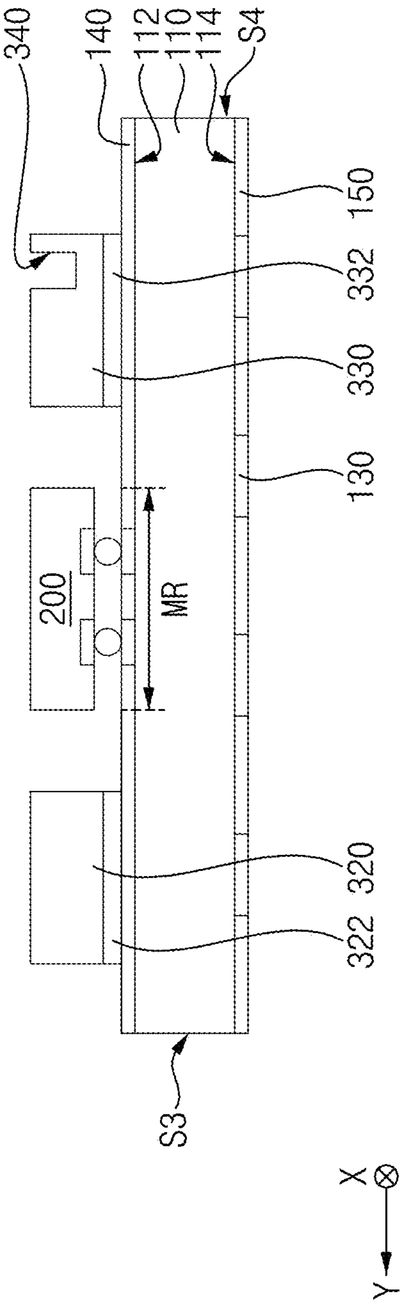
Figure 14:
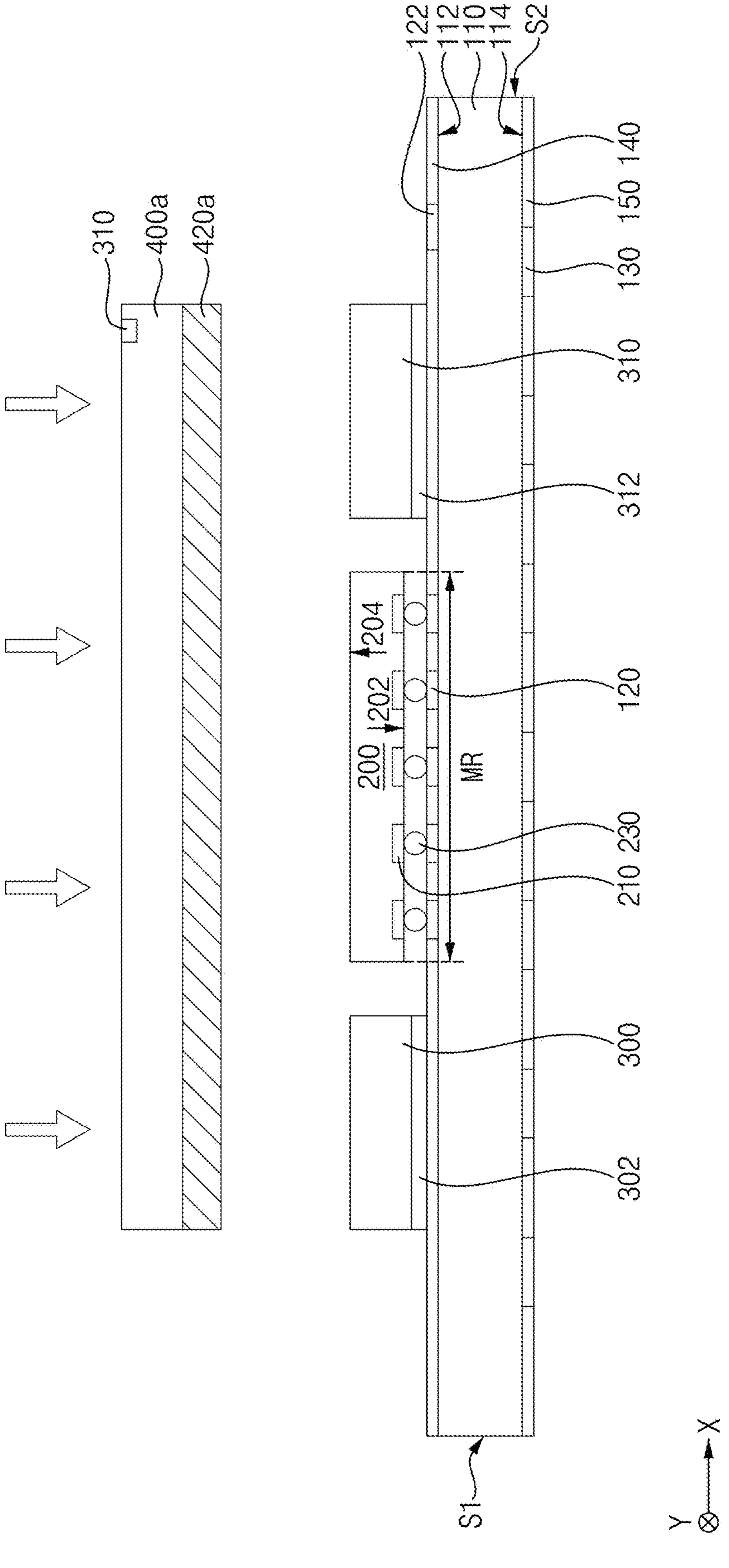
Figure 15:
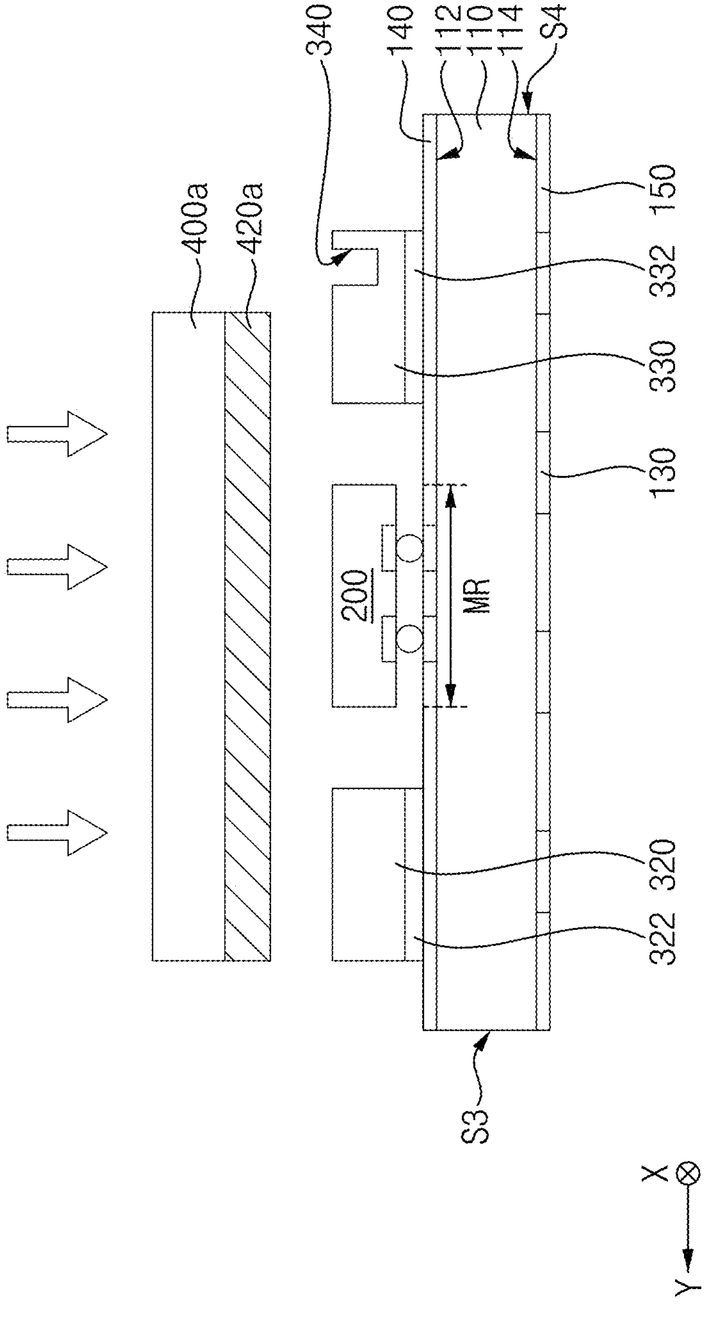
Figure 16:
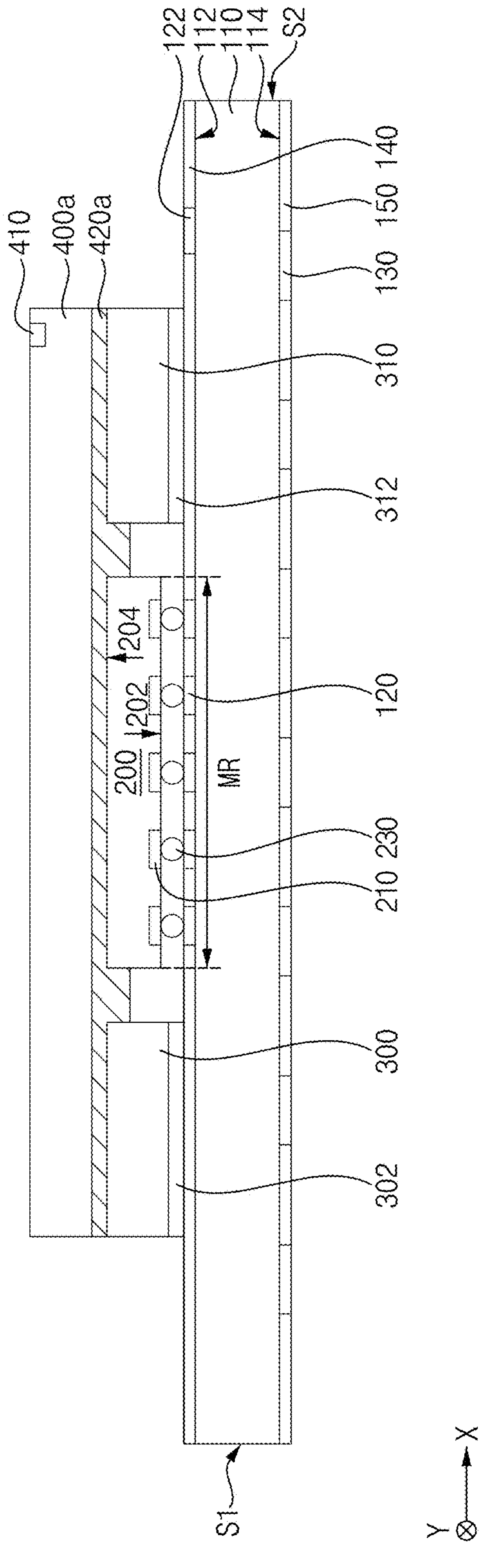
Figure 17:
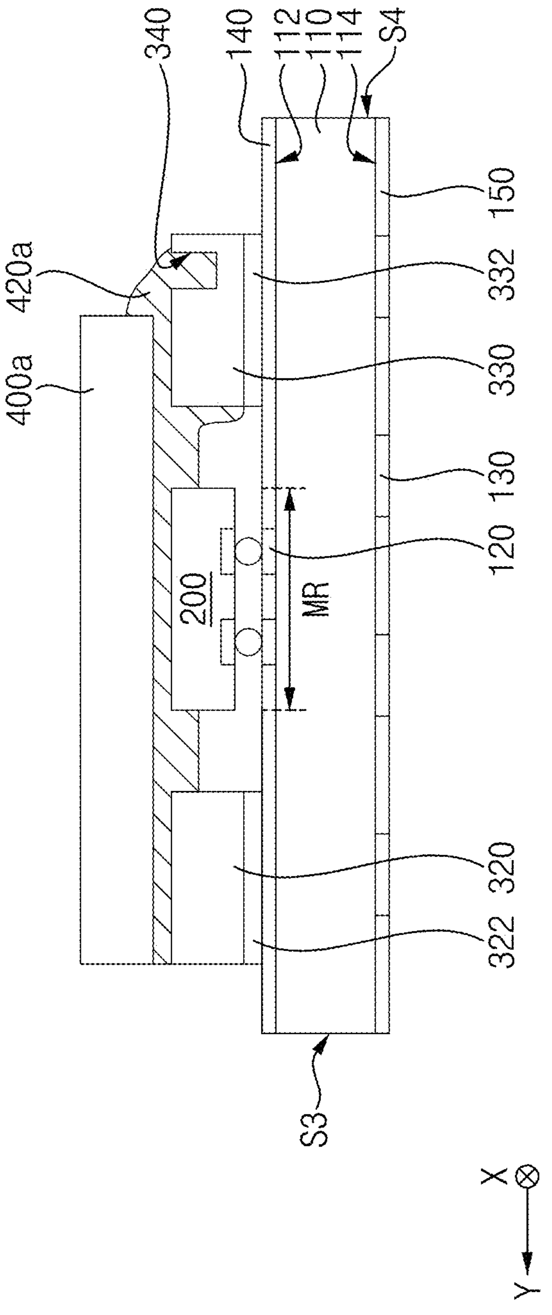

Referring to FIGS. 12 and 13, a first semiconductor chip 200 may be mounted on the package substrate 110.

In some example embodiments, the first semiconductor chip 200 may be mounted on the package substrate 110 via conductive bumps 230. The first semiconductor chip 200 may be disposed such that a front surface 202 (e.g., an active surface) on which first chip pads 210 are formed faces the package substrate 110. When viewed in plan view, the first semiconductor chip 200 may have a quadrangular shape having four sides. The first chip pads 210 may be arranged in an array form over the entire front surface 202 of the first semiconductor chip 200.

The first semiconductor chip 200 may be a logic chip including a logic circuit. The logic chip may be a controller that controls memory chips. The first semiconductor chip may be a processor chip such as an ASIC or an application processor (AP) serving as a host such as a CPU, GPU, or SOC.

The first semiconductor chip 200 may be mounted on the package substrate 110 by a flip chip bonding method. The first chip pads 210 of the first semiconductor chip 200 may be electrically connected to the first substrate pads 120 of the package substrate 110 by conductive bumps 230, for example, solder bumps.

For example, a thickness of the first semiconductor chip 200 may be within a range of 90 μm to 110 μm. A height of the conductive bump 230 from the upper surface 112 of the package substrate 110 may be within a range of 35 μm to 60 μm. A height of the first semiconductor chip 200 from the upper surface 112 of the package substrate 110 may be within a range of 135 μm to 160 μm. The height of the first semiconductor chip 200 may be equal to or greater than heights of upper surfaces of the first, second, third and fourth spacer chips 300, 310, 320 and 330. In other words, an upper surface of the first semiconductor chip 200 from the upper surface 112 of the package substrate 110 may be equal to or at a higher level than heights of upper surfaces of the first, second, third and fourth spacer chips 300, 310, 320 and 330 from the upper surface 112 of the package substrate 110.

In some example embodiments, after the first semiconductor chip is attached on the upper surface 112 of the package substrate 110 using an adhesive film, a wire bonding process may be performed to connect the first chip pads 210 of the first semiconductor chip 200 and the substrate pads on the upper surface 112 of the substrate 110. The first chip pads 210 of the first semiconductor chip 200 may be connected to the first substrate pads 120 by conductive connection members. The conductive connection members may include bonding wires.

Referring to FIGS. 14 to 19, a plurality of second semiconductor chips 400 may be attached on the first, second, third and fourth spacer chips 300, 310, 320 and 330 using an adhesive film 420.

As illustrated in FIGS. 14 to 17, a lowermost second semiconductor chip 400*a* may be attached to the first, second, third and fourth spacer chips 300, 310, 320 and 330 and the first semiconductor chip 200 using a first adhesive film 420*a* such as a die attach film (DAF) by a die attach process.

The second semiconductor chip 300*a* may be disposed such that a backside surface (e.g., a non-active surface) opposite to a front surface on which second chip pads 410 are formed faces the package substrate 110. When viewed in plan view, the second semiconductor chip 400*a* may have a quadrangular shape having four sides.

The second semiconductor chip may include a memory chip including a memory circuit. For example, the second semiconductor chip may include a volatile memory device such as an SRAM device and a DRAM device, and a non-volatile memory device such as a flash memory device, a PRAM device, an MRAM device and an RRAM device.

In some example embodiments, at least a portion of the fourth spacer chip 330 may protrude from one side of the lowermost second semiconductor chip 400*a*. When viewed in plan view, the groove 340 may be provided in the upper surface of a portion of the fourth spacer chip 330 that protrudes from a sidewall of the lowermost second semiconductor chip 400*a*.

For example, the first adhesive film 420*a* may be attached to the backside surface of the second semiconductor chip 400*a*, and the second semiconductor chip 400*a* to which the first adhesive film 420*a* is attached may be attached on the first, second, third and fourth spacer chips 300, 310, 320 and 330 and the first semiconductor chip 200 by a thermal compression process. The second semiconductor chip 400*a* may be pressed onto the first, second, third and fourth spacer chips 300, 310, 320, and 330 by a die attaching tool, and may be heated to a high temperature by a heater block inside a support system that supports the package substrate 110. A thickness of the first adhesive film 420*a* may be within a range of 60 μm to 120 μm.

A portion of the DAF having fluidity due to such pressure and temperature may flow onto the upper surface of the fourth spacer chip 330 that protrudes from the sidewall of the second semiconductor chip 400*a* and then may at least partially fill the groove 340 of the fourth spacer chip 330, to thereby mitigate or prevent the portion of the DAF from overflowing to penetrate into an upper surface of the lowermost second semiconductor chip 400*a*.

Figure 18:
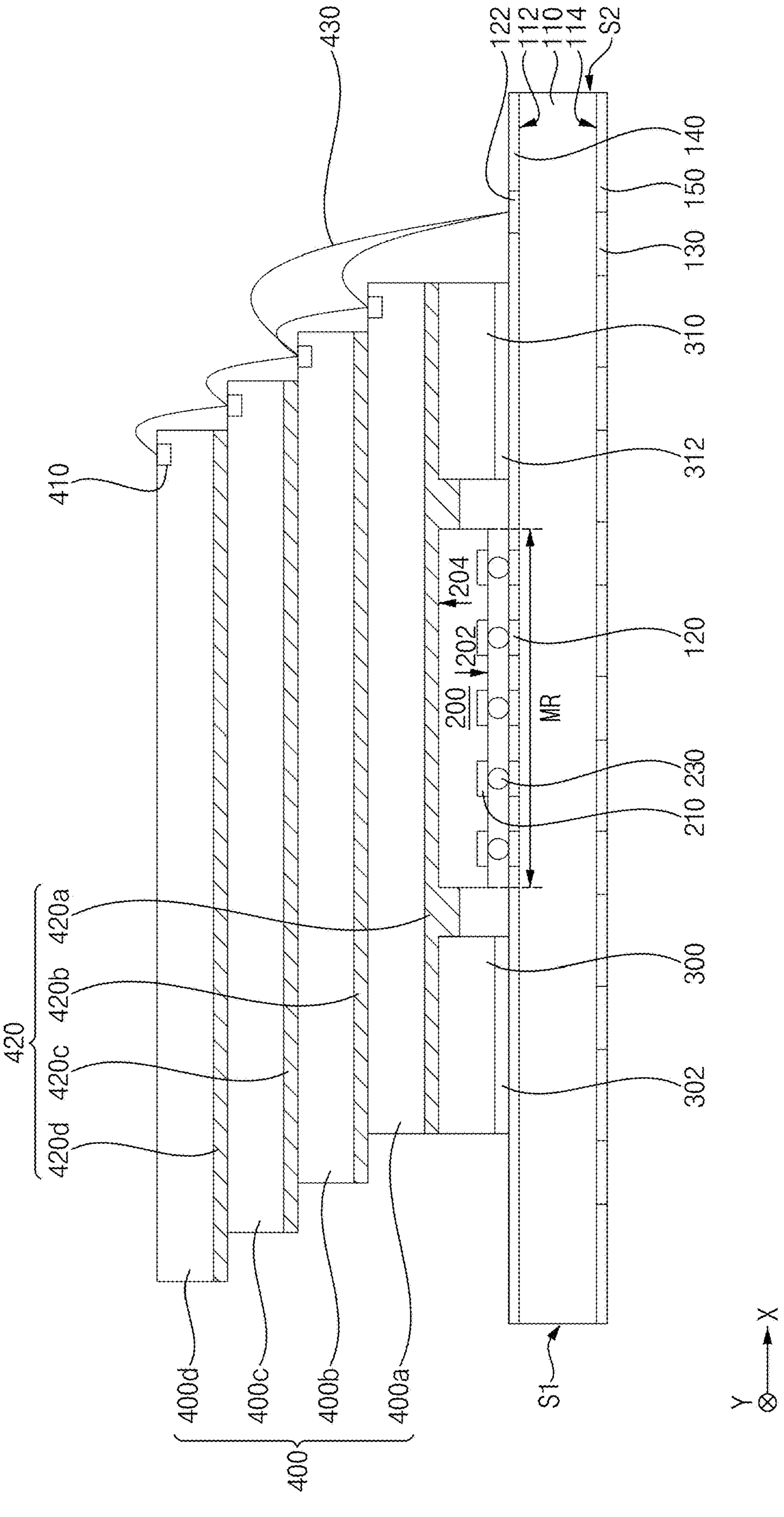
Figure 19:
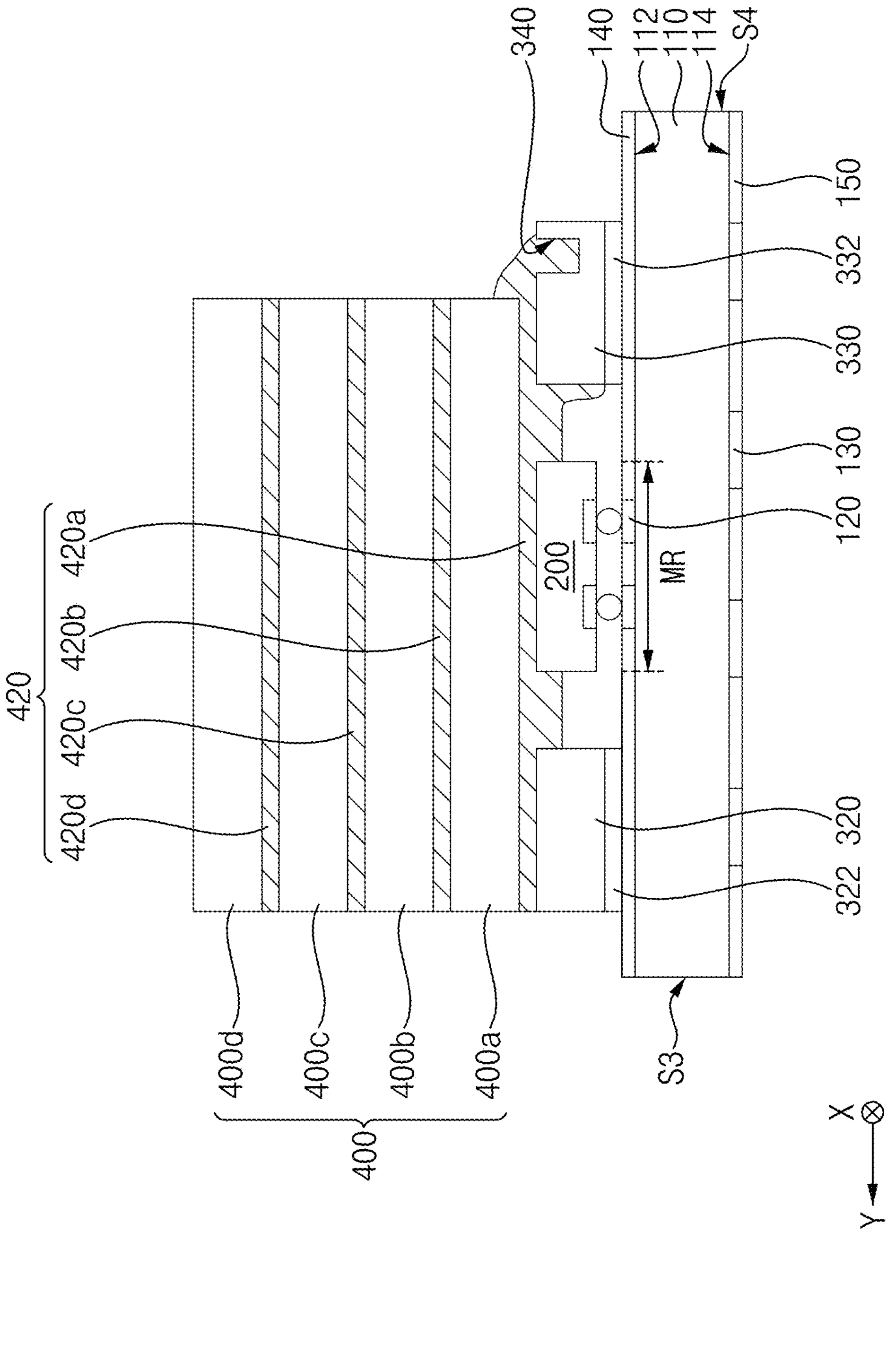

Then, as illustrated in FIGS. 18 and 19, the remaining chips 400*b*, 400*c* and 400*d* among the plurality of second semiconductor chips may be sequentially attached to the lowermost second semiconductor chip 400*a* using second adhesive films 420*b*, 420*c* and 420*d*. The second semiconductor chips 400*b*, 400*c* and 400*d* may be sequentially attached on the lowermost second semiconductor chip 400*a* using the second adhesive films 420*b*, 420*c* and 420*d* such as a die attach film (DAF) by a die attach process. Thicknesses of the second adhesive films 420*b*, 420*c* and 420*d* may be within a range of 10 μm to 20 μm.

A planar area of the second semiconductor chip may be greater than a planar area of the first semiconductor chip or the support frame structure. Accordingly, the second semiconductor chips 400*a*, 400*b*, 400*c* and 400*d* may be supported and mounted on the package substrate 110 by the first, second, third and fourth spacer chips 300, 310, 320 and 330.

The plurality of second semiconductor chips 400*a*, 400*b*, 400*c* and 400*d* may be sequentially offset aligned. For example, the second semiconductor chips 400*a*, 400*b*, 400*c*, and 400*d* may be stacked in a cascade structure. The second semiconductor chips 400*a*, 400*b*, 400*c* and 400*d* may be sequentially offset-aligned in a first lateral direction (−X direction) of the package substrate 110.

The number, sizes, arrangements, etc. of the second semiconductor chips are provided as examples, and it will be understood that the present inventive concepts are not limited thereto. Additionally, although only a few second chip pads are illustrated in the figures, the structures, shapes, and arrangements of the second chip pads are provided as examples, and it will be understood that the present inventive concepts are not limited thereto.

Then, the second semiconductor chips 400 may be electrically connected to the package substrate 110 by conductive connecting members 430.

In some example embodiments, the second chip pads 410 of the second semiconductor chips 400 may be connected to the second substrate pads 122 on the upper surface 112 of the package substrate 110 by bonding wires 430 by a wire bonding process.

Then, a sealing member 500 (see FIG. 2) may be formed on the upper surface 112 of the package substrate 110 to cover the first, second, third and fourth spacer chips 300, 310, 320 and 330, the second semiconductor chips 400 and the bonding wires 430. The sealing member may include a thermosetting resin, for example, epoxy molding compound (EMC).

Then, external connection members may be formed on external connection pads 130 on the lower surface 114 of the package substrate 110 to complete the semiconductor package 100 of FIG. 1.

For example, the external connection members may include solder balls. The external connection members may be respectively formed on the external connection pads 130 of the lower surface 114 of the package substrate 110 by a solder ball attach process.

The semiconductor package may include semiconductor devices such as logic devices or memory devices. The semiconductor package may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present inventive concepts. Accordingly, all such modifications are intended to be included within the scope of example embodiments as defined in the claims.

What is claimed is:

1. A semiconductor package, comprising:

a package substrate;

a first spacer chip and a second spacer chip attached to an upper surface of the package substrate, the first spacer chip and the second spacer chip being spaced apart from each other;

a first semiconductor chip on the upper surface of the package substrate and between the first spacer chip and the second spacer chip;

a plurality of second semiconductor chips sequentially stacked on the the first spacer chip and the second spacer chip by adhesive films to cover the first semiconductor chip; and a sealing member on the package substrate and covering the first spacer chip and the second spacer chip, the first semiconductor chip, and the plurality of second semiconductor chips, wherein the first spacer chip includes a first portion under a lowermost second semiconductor chip among the plurality of second semiconductor chips and a second portion protruding from one side of the lowermost second semiconductor chip, wherein the first spacer chip includes a groove at an upper surface of the second portion, and wherein a bottommost adhesive film from among the adhesive films that is on a bottom surface of the lowermost second semiconductor chip at least partially fills the groove and does not run onto an upper surface of the lowermost second semiconductor chip.

2. The semiconductor package of claim 1, wherein the lowermost second semiconductor chip is attached to the first spacer chip by a first adhesive film among the adhesive films, and the first adhesive film at least partially fills the groove of the first spacer chip.

3. The semiconductor package of claim 2, wherein remaining chips of the plurality of second semiconductor chips are sequentially attached to the lowermost second semiconductor chip by second adhesive films among the adhesive films.

4. The semiconductor package of claim 1, wherein the groove extends in a first direction along a peripheral region of the first spacer chip.

5. The semiconductor package of claim 4, further comprising:

a second groove extending across the groove.

6. The semiconductor package of claim 1, wherein a depth of the groove is within a range of 10 μm to 80 μm, and a width of the groove is within a range of 20 μm to 120 μm.

7. The semiconductor package of claim 1, wherein the first spacer chip has a thickness of 40 μm to 120 μm.

8. The semiconductor package of claim 1, further comprising:

a third spacer chip and a fourth spacer chip attached to the upper surface of the package substrate, the third spacer chip and the fourth spacer chip being spaced apart from each other, the first semiconductor chip being interposed between the third spacer chip and the fourth spacer chip, wherein the third spacer chip and the fourth spacer chip are arranged in a first direction that is perpendicular to a second direction in which the first spacer chip and the second spacer chip are arranged.

9. The semiconductor package of claim 8, wherein the plurality of second semiconductor chips are sequentially offset-aligned in the first direction on the third spacer chip and the fourth spacer chip.

10. The semiconductor package of claim 1, wherein the adhesive films include a die attach film.

11. A semiconductor package, comprising:

a package substrate extending in a first direction;

a first semiconductor chip on an upper surface of the package substrate;

a first spacer chip and a second spacer chip attached to the upper surface of the package substrate, the first spacer chip and the second spacer chip being spaced apart from each other in a second direction perpendicular to the first direction, the first semiconductor chip being interposed between the first spacer chip and the second spacer chip;

a third spacer chip and a fourth spacer chip attached to the upper surface of the package substrate, the third spacer chip and the fourth spacer chip being spaced apart from each other in the first direction, the first semiconductor chip being interposed between the third spacer chip and the fourth spacer chip;

a plurality of second semiconductor chips sequentially stacked on the first spacer chip, the second spacer chip, the third spacer chip, and the fourth spacer chip by adhesive films to cover the first semiconductor chip; and a sealing member on the package substrate and covering the first spacer chip, the second spacer chip, the third spacer chip, and the fourth spacer chip, the first semiconductor chip and the plurality of second semiconductor chips, wherein the first spacer chip includes a first portion under a lowermost second semiconductor chip among the plurality of second semiconductor chips and a second portion protruding from one side of the lowermost second semiconductor chip, wherein the first spacer chip includes a groove at an upper surface of the second portion, and wherein a bottommost adhesive film from among the adhesive films that is on a bottom surface of the lowermost second semiconductor chip at least partially fills the groove and does not run onto an upper surface of the lowermost second semiconductor chip.

12. The semiconductor package of claim 11, wherein the lowermost second semiconductor chip is attached to the first spacer chip by a first adhesive film among the adhesive films, and the first adhesive film at least partially fills the groove of the first spacer chip.

13. The semiconductor package of claim 12, wherein remaining chips of the plurality of second semiconductor chips are sequentially attached to the lowermost second semiconductor chip by second adhesive films among the adhesive films.

14. The semiconductor package of claim 11, wherein the groove extends in the first direction along a peripheral region of the first spacer chip.

15. The semiconductor package of claim 14, further comprising:

a second groove extending across the groove.

16. The semiconductor package of claim 11, wherein a depth of the groove is within a range of 10 μm to 80 μm, and a width of the groove is within a range of 20 μm to 120 μm.

17. The semiconductor package of claim 11, wherein the first spacer chip has a thickness of 40 μm to 120 μm.

18. The semiconductor package of claim 11, wherein the plurality of second semiconductor chips are sequentially offset-aligned in the first direction.

19. The semiconductor package of claim 11, wherein at least one of the first spacer chip, the second spacer chip, the third spacer chip, and the fourth spacer chip includes a silicon material.

20. A semiconductor package, comprising:

a package substrate extending in a first direction, having an upper surface and a lower surface opposite to the upper surface, and having a plurality of substrate pads on the upper surface;

a first semiconductor chip on the upper surface of the package substrate;

a first spacer chip and a second spacer chip attached to the upper surface of the package substrate, the first spacer chip and the second spacer chip being spaced apart from each other in a second direction perpendicular to the first direction, the first semiconductor chip being interposed between the first spacer chip and the second spacer chip;

a third spacer chip and a fourth spacer chip attached to the upper surface of the package substrate, the third spacer chip and the fourth spacer chip being spaced apart from each other in the first direction, the first semiconductor chip being interposed between the third spacer chip and the fourth spacer chip;

a plurality of second semiconductor chips sequentially stacked on the first spacer chip, the second spacer chip, the third spacer chip, and the fourth spacer chip by adhesive films to cover the first semiconductor chip;

conductive connection members electrically connecting chip pads of the plurality of second semiconductor chips to the plurality of substrate pads, respectively; and a sealing member on the package substrate and covering the first spacer chip, the second spacer chip, the third spacer chip, and the fourth spacer chip, the first semiconductor chip, and the plurality of second semiconductor chips, wherein the first spacer chip includes a first portion under a lowermost second semiconductor chip among the plurality of second semiconductor chips and a second portion protruding from one side of the lowermost second semiconductor chip, wherein the first spacer chip includes a groove having a depth and a width at an upper surface of the second portion, and wherein a bottommost adhesive film from among the adhesive films that is on a bottom surface of the lowermost second semiconductor chip at least partially fills the groove of the first spacer chip and does not run onto a top surface of the lowermost second semiconductor chip.

* * * * *